United States Patent [19]

Sakudo et al.

[11] Patent Number: 4,924,101

[45] Date of Patent: May 8, 1990

[54] CHARGED PARTICLE SOURCE

[75] Inventors: Noriyuki Sakudo, Ome; Hifumi Tamura, Hachioji, both of Japan

[73] Assignee: Hitachi, Ltd., Tokyo, Japan

[21] Appl. No.: 141,145

[22] Filed: Jan. 6, 1988

[30] Foreign Application Priority Data

Feb. 27, 1987 [JP] Japan .................................. 62-42557

[51] Int. Cl.[5] .............................................. H01J 37/08

[52] U.S. Cl. ............................ 250/423 R; 315/111.81

[58] Field of Search ........................ 250/288 A, 423 R; 315/111.81; 313/336; 328/228

[56] References Cited

U.S. PATENT DOCUMENTS

| | | | |
|---|---|---|---|
| 4,570,068 | 2/1986 | Sakairi et al. | 250/288 A |
| 4,667,100 | 5/1987 | Lagna | 250/281 |
| 4,680,507 | 7/1987 | Uemura et al. | 315/111.81 |

FOREIGN PATENT DOCUMENTS

| | | |
|---|---|---|
| 202685 | 11/1986 | European Pat. Off. . |
| 204297 | 12/1986 | European Pat. Off. . |
| 52-35839 | 12/1977 | Japan . |
| 56-112058 | 4/1981 | Japan . |
| 60-249234 | 12/1985 | Japan . |

OTHER PUBLICATIONS

*Advances in Electronics and Electron Physics*, vol. XIII, 1960, pp. 83-95.

*Primary Examiner*—Bruce C. Anderson
*Attorney, Agent, or Firm*—Antonelli, Terry, Stout & Kraus

[57] ABSTRACT

A charged particle source for emitting a positive ion or electron by applying a positive or negative potential to a tip electrode covered with a liquid substance is disclosed in which mechanical vibration is applied to the tip electrode so that a favorable standing wave is formed in the liquid substance, to vary the shape of a charged-particle emitting portion of the liquid substance periodically, thereby changing the intensity of an emitted, charged-particle beam periodically, and thus a pulsed beam having a repetition rate up to the GHz band can be obtained without increasing the energy dispersion of the beam.

8 Claims, 2 Drawing Sheets

CHARGED PARTICLE SOURCE

BACKGROUND OF THE INVENTION

The present invention relates to focused ion/electron beam technology, and more particularly to a charged particle source capable of emitting a high repetition-rate pulsed beam up to the GHz band stably, without causing variations in energy of emitted, charged particles.

A pulsed, focused beam has not yet been used, but can be produced by the prior art. As is evident from JP-B No. 52-35839 (published on Sept. 12, 1977), an emission current can be varied in such a manner that a control electrode is disposed in the neighborhood of a tip electrode and a voltage applied to the control electrode is varied. In more detail, the above publication discloses that the emission current can be stabilized by feeding a monitor current signal back to the voltage applied to the control electrode. Accordingly, it is possible to produce a pulsed beam by applying an A.C. voltage (for example, a high frequency voltage) to the control electrode. In this case, however, an A.C. electric field (that is, a high frequency electric field) which is generated on the basis of the high frequency voltage applied to the control electrode, is superposed on an acceleration electric field. When ions, which are larger in mass and hence lower in traveling speed than electrons, are generated and accelerated, the electric field intensity of an acceleration region varies while the ions travel through the acceleration region. Accordingly, the kinetic energy of an accelerated ion depends upon the phase of high frequency voltage at the time when the ion is generated. This causes the energy dispersion of an ion beam. This energy dispersion increases as the repetition rate of the pulsed beam is larger. Furthermore, in a case where a pulsed beam having a repetition rate in the GHz band is generated, it is necessary to use microwave circuit technology, and it is difficult to apply such technology to a conventional source for emitting a focused, charged-particle beam.

Further, JP-A No. 56-1120582 (laid open on Sept. 4, 1981) discloses a high intensity ion source in which a tip electrode is covered with a liquid metal and the liquid metal is subjected to an electric field for emission of ions.

SUMMARY OF THE INVENTION

It is accordingly an object of the present invention to provide a charged particle source which can emit a pulsed, charged-particle beam having a repetition rate up to the GHz band, without increasing the energy dispersion of the charged particle beam.

In order to attain the above object, according to one aspect of the present invention, a liquid substance (such as liquid Galium or some various kinds of liquid alloys) for covering a tip electrode is subjected to mechanical vibration to produce a standing wave in the liquid substance, thereby varying the shape of a charged-particle emitting portion, periodically, and thus the electric field intensity at the emitting portion is varied periodically, which makes possible the emission of a pulsed, charged-particle beam.

As the for the above-mentioned liquid substance, use may be made of a metal such as Ga, Au, Hg, Al or Bi or an electrically conductive material other than metal.

In more detail, as shown in FIGS. 2A and 2B, the shape of an end portion of a liquid substance 2 for covering a tip electrode 1 varies periodically in such a manner that the liquid substance 2 is put in a state 3 or 3' and another state 4 or 4' alternately. FIG. 2A shows a case where the liquid substance vibrates at a high frequency, and FIG. 2B shows a case where the liquid substance vibrates at a low frequency. In other words, the radius r of curvature of an end portion of the liquid substance 2 varies periodically, and thus the electric field intensity E at the end portion also varies periodically. According to an experimental formula given by Müller (Advances in Electronics and Electron Physics, Vol. XIII, 1960, pages 83 to 95), the electric field intensity E is expressed as follows:

$$E = V/5r \qquad (1)$$

where V indicates a difference in electric potential between the tip electrode and an extraction electrode. As is evident from the above equation (1), the electric field intensity E increases as the radius r of curvature is smaller. As shown in FIG. 3, an ion or electron current increases greatly with the increasing electric field intensity E, when the electric field intensity E exceeds a threshold intensity $E_0$. When the tip electrode 1 is at a positive potential with respect to the extraction electrode, a positive ion can be emitted from the liquid substance. When the tip electrode 1 is at a negative potential with respect to the extraction electrode, an electron or negative ion can be emitted from the liquid substance. The liquid substance 2 can emit a pulsed ion (or electron) beam by setting the potential difference between the tip electrode and the extraction electrode so that the electric field intensity E at a time the liquid substance 2 is put in the state 4 is smaller than the threshold intensity $E_0$ and the electric field intensity at a time the liquid substance is put in the state 3 is greater than the threshold intensity $E_0$. When a supersonic vibrator is used for applying mechanical vibration to the liquid substance, a pulsed beam having a repetition rate of 1 kHz to 10 GHz can be emitted from the liquid substance.

DESCRIPTION OF THE PREFERRED EMBODIMENTS

Figure 1:
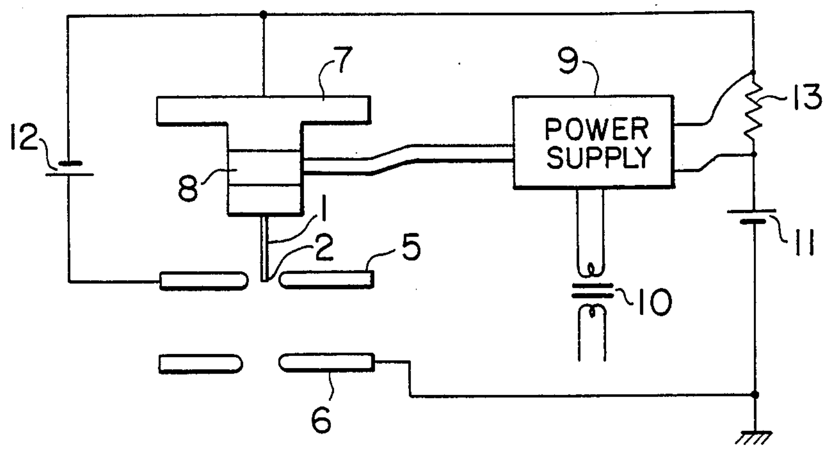
FIG. 1 is a schematic diagram showing an embodiment of a charged particle source according to the present invention.
Figure 2A:
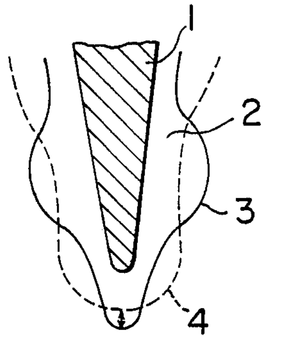
FIGS. 2A and 2B are schematic diagrams for explaining the operation principle of the present invention.
Figure 2B:
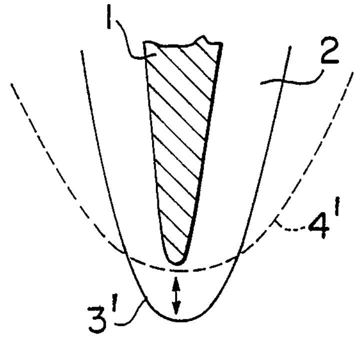
Figure 3:
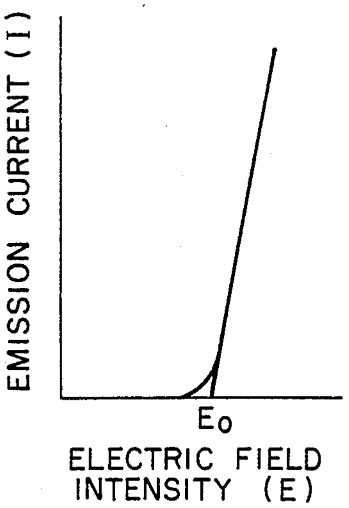
FIG. 3 is a graph showing a relationship between the electric field intensity E and an emission current I of a conventional charged particle source which is provided with a tip electrode.
Figure 4:
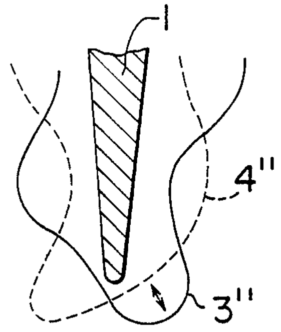
FIG. 4 is a schematic diagram showing an unfavorable standing wave which is made in a liquid substance.

Now, explanation will be made of an embodiment of a charged particle source according to the present invention, with reference to FIG. 1. Referring to FIG. 1, a tip electrode 1 covered with a liquid substance 2 is vibrated by a mechanical vibrator 8 which utilizes electrostriction or magnetostriction. These are mounted on a flange 7. The vibrator 8 is driven by a voltage from a power supply 9, which is insulated from ground by an insulation transformer 10. Further, the tip electrode 1 is supplied with an ion acceleration voltage from an acceleration power supply 11, and an extraction electrode 6 is supplied with, for example, a ground potential. An auxiliary electrode 5 is supplied with a bias voltage from a power supply 12. The liquid substance 2 which covers the surface of the tip electrode 1, is subjected to an electrostatic force due to not only a voltage applied between the tip electrode 1 and the extraction electrode 6 but also a voltage applied between the tip electrode 1 and the auxiliary electrode 5. Thus, the liquid substance 2 has the form of a circular cone. When the vibrator 8 is driven in this state, a wave is generated in the liquid substance 2 by the mechanical vibration of the tip electrode 1, and a standing wave as shown in FIG. 2A or 2B is formed. The wavelength and shape of the standing wave depend upon not only the vibration frequency of the mechanical vibration but also the surface tension and density of the liquid substance 2. In other words, the liquid substance 2 is not always put in the vibrational state shown in FIGS. 2A or 2B, but may be in the state represented by 3″ or 4″ with the result that a node may be formed at an end portion of the liquid substance 2 as shown in FIG. 4. In this case, it is necessary to change the vibration frequency of the mechanical vibrator so that a loop is formed in an end portion of the liquid substance 2, and hence the power supply 9 has an adjusting function of changing the vibration frequency. Thus, a standing wave can be generated so that an end of the liquid substance 2 acts as the loop of the standing wave.

Further, a voltage appearing across a resistor 13 for emission current measurement is smoothed, and then negatively fed back to a driving voltage for the vibrator 8, to control the intensity of vibration, thereby stabilizing an emission current.

Alternately, a signal indicative of a current flowing into the extraction electrode 6, or an output signal from a current sensor which is disposed downstream from the extraction electrode 6, may be used in place of the voltage appearing across the resistor 13.

Figure 5:
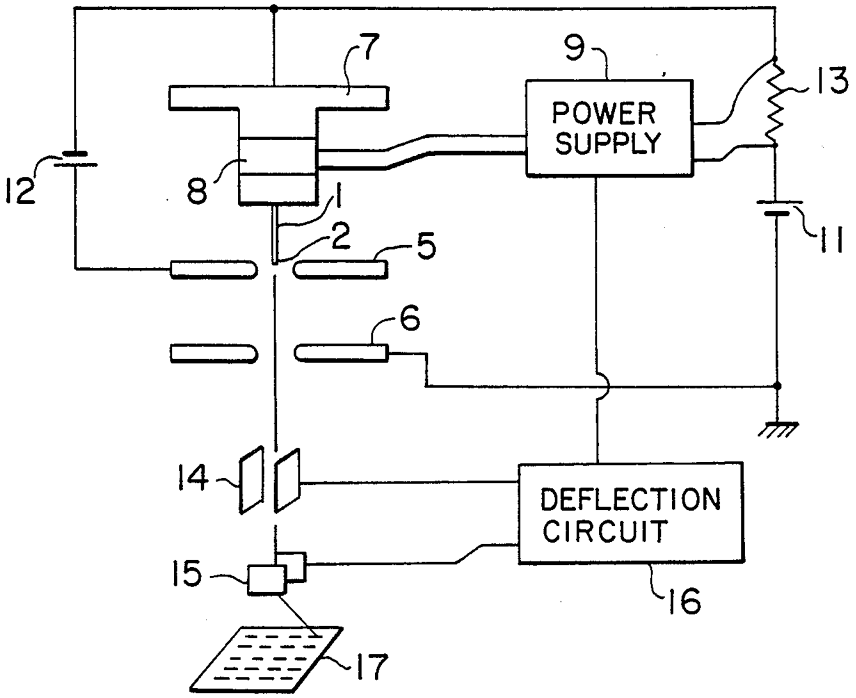
FIG. 5 is a schematic diagram showing another embodiment of a charged particle source according to the present invention.

FIG. 5 shows another embodiment of a charged particle source according to the present invention. Referring to FIG. 5, an X-deflector 14 and a Y-deflector 15 are disposed under the extraction electrode 6, to deflect a charged particle beam emitted from the liquid substance 2. The deflectors 14 and 15 are operated by signals from a deflection circuit 16. When the signals for operating the deflectors 14 and 15 are synchronized with a signal for driving the vibrator 8, a specimen surface 17 is irradiated periodically with the charged particle beam in each of X- and Y-directions, as indicated by a pattern on the specimen surface 17. Examples of the specimen whose surface 17 is radiated are a semiconductor substrate having chips on which identical patterns are to be drawn, substrates with an electron beam resist layer thereon, etc.

In the embodiments of FIGS. 1 and 5, a positive ion is emitted from the liquid substance 2. However, when the polarity of the acceleration power supply 11 is reversed, an electron or a negative ion can be emitted from the liquid substance 2.

According to the above-described embodiments of the present invention, the following advantages are expected.

(1) A pulsed, focused beam having a repetition rate in the GHz band which cannot be produced by the prior art, can be obtained without increasing the energy dispersion of the beam. In some application fields, the pulsed, focused beam can be used as a D.C. beam.

(2) A pulsed, charged-particle beam can be extracted from the liquid substance by a weaker electric field, as compared with a case where the beam is extracted without vibrating the tip electrode. Accordingly, the vibrational state of the liquid substance is stable, and thus the pulsed beam is emitted stably.

(3) The energy dispersion of the pulsed beam is smaller, as compared with a case where an A.C. voltage is superposed on the D.C. acceleration voltage, or an A.C. voltage is applied to the auxiliary electrode.

We claim:

1. A charged particle source comprising:

a tip electrode covered with a liquid substance and having an end portion, said liquid substance having a threshold electric field intensity value for emission of charged particles.;

means for applying a voltage to said tip electrode to generate an electric field; and means for varying the shape of said liquid substance on said tip electrode periodically to vary the intensity of said electric field at that part of said liquid substance which is on said end portion of said tip electrode wherein the periodic variation of said electric field intensity at said part is a variation between electrode field intensity values larger than and smaller than said threshold electric field intensity value for emission of a pulsed charged particle beam.

2. A charged particle source according to claim 1, wherein said means for varying the shape of said liquid substance periodically, comprises means for applying mechanical vibration to said liquid substance to produce a standing wave therein.

3. A charged particle source according to claim 2, wherein said means for producing the standing wave is a mechanical vibrator which utilizes at least one of electrostriction and magnetostriction.

4. A charged particle source according to claim 3, wherein said mechanical vibrator is connected to an adjustable power supply for adjusting the vibration frequency of said mechanical vibrator.

5. A charged particle source according to claim 3, wherein at least one of an emission current from the charged particle source and a monitor current for said emission current is negatively fed back to a power supply for the mechanical vibrator.

6. A charged particle source according to claim 2, further comprising a deflecting means for deflecting a charged particle beam in synchronism with said mechanical vibration, wherein the frequency of the beam deflection is equal to the frequency of said mechanical vibration or the frequency obtained by dividing said frequency of said mechanical vibration by an integer which is larger than one.

7. A charged particle source according to claim 1, wherein the electric field intensity at the emission point of charged particles varies with the shape of said liquid substance, and the voltage applied to said tip electrode is set so that a minimum value of the electric field intensity at said emission point is smaller than a threshold field intensity, at which said liquid substance begins to emit charged particles.

8. A charged particle source according to claim 1, wherein the means for varying the shape of the liquid substance generates a mechanical standing wave in the liquid substance.

* * * * *